US 6,564,018 B2

(12) United States Patent
Melman et al.

(10) Patent No.: US 6,564,018 B2
(45) Date of Patent: May 13, 2003

(54) IMAGING DEVICE FOR DIGITAL PHOTOGRAPHY

(75) Inventors: Haim Zvi Melman, Kfar Saba (IL); Daniel Gelbart, Vancouver (CA)

(73) Assignee: Creoscitek Corporation Ltd., Herzlia (IE)

( * ) Notice: Subject to any disclaimer, the term of this patent is extended or adjusted under 35 U.S.C. 154(b) by 0 days.

(21) Appl. No.: 09/860,672

(22) Filed: May 21, 2001

(65) Prior Publication Data

US 2002/0003960 A1 Jan. 10, 2002

Related U.S. Application Data

(63) Continuation-in-part of application No. 09/364,488, filed on Jul. 30, 1999, now abandoned, which is a continuation-in-part of application No. 08/925,343, filed on Sep. 8, 1997, now Pat. No. 6,134,393.

(30) Foreign Application Priority Data

Sep. 9, 1996 (IL) .................................................. 119227
Sep. 8, 1997 (US) ........................................... 081925343
Jul. 30, 1999 (US) ........................................... 091364488

(51) Int. Cl.$^7$ ............................ H01L 23/02; H04N 5/225
(52) U.S. Cl. ......................... 396/429; 348/64; 348/294; 348/340; 257/680
(58) Field of Search ........................... 396/429, 439, 396/535, 536, 374; 257/621, 680; 348/64, 294, 335, 340

(56) References Cited

U.S. PATENT DOCUMENTS

| | | | |
|---|---|---|---|
| 3,462,650 A | 8/1969 | Hennings et al. | |
| 3,622,419 A | * 11/1971 | London et al. | 156/293 |
| 3,836,393 A | 9/1974 | Ernsthausen et al. | |
| 3,919,452 A | 11/1975 | Ettre et al. | |
| 3,957,537 A | 5/1976 | Baskett et al. | |
| 4,184,903 A | 1/1980 | Dillard | |
| 4,745,470 A | 5/1988 | Yabe et al. | |
| 4,999,484 A | 3/1991 | Kancko | |
| 5,282,040 A | 1/1994 | Sapir | |
| 5,300,767 A | 4/1994 | Steinle et al. | |
| 5,343,071 A | 8/1994 | Kazior et al. | |
| 5,433,911 A | 7/1995 | Ozimek et al. | |
| 5,483,284 A | 1/1996 | Ishiguro | |
| 5,528,080 A | 6/1996 | Goldstein | |
| 5,561,458 A | 10/1996 | Cronin et al. | |
| 6,134,393 A | 10/2000 | McIman | |

* cited by examiner

Primary Examiner—David M. Gray
(74) Attorney, Agent, or Firm—Eitan, Pearl, Latzer & Cohen-Zedek

(57) ABSTRACT

An imaging device and a camera with an imaging device for imaging and digital photography are provided. The imaging device includes an imaging die having an electrical circuit on a surface thereof, a glass cover having a first surface and a second surface, and connecting means for connecting the first surface of the glass cover to the surface of the imaging die, wherein the connecting means have a refractive index substantially equal to the refractive index of the glass cover. The connecting means may include spectral filtering means. The first surface of the glass cover may be coated with spectral filtering means.

4 Claims, 12 Drawing Sheets

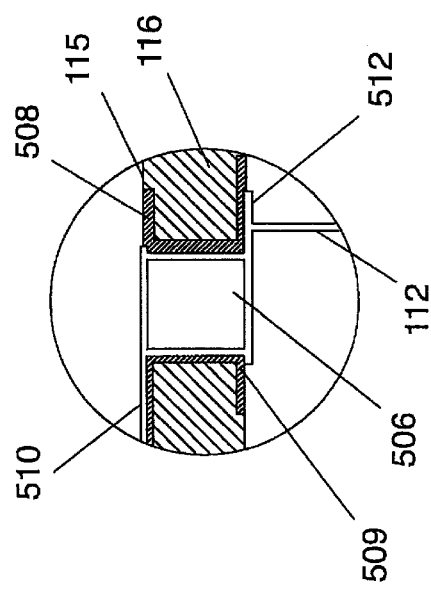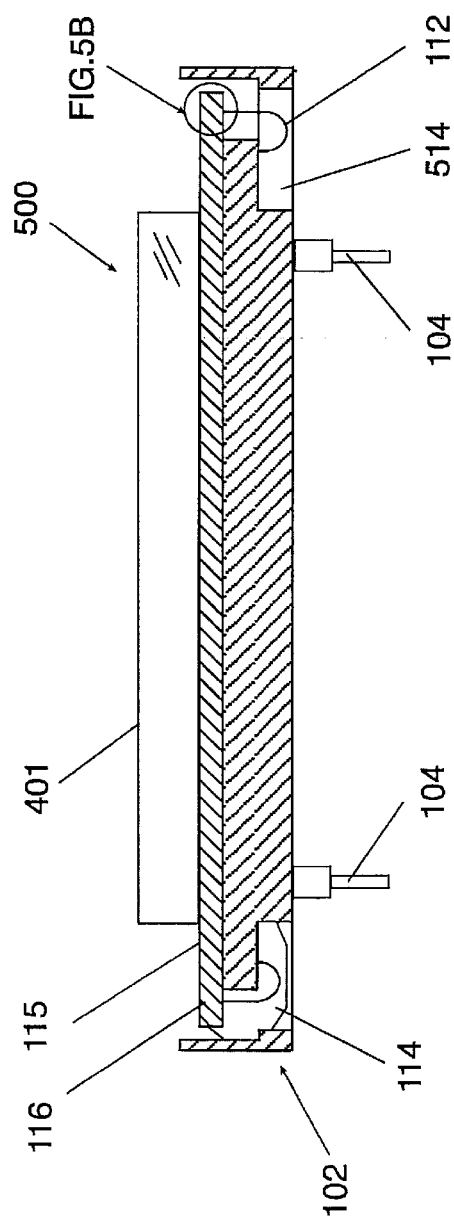
FIG.5B
FIG.5A

IMAGING DEVICE FOR DIGITAL PHOTOGRAPHY

REFERENCE TO RELATED APPLICATIONS

This application is a continuation-in-part Application of U.S. patent application Ser. No. 09/364,488, filed Jul. 30, 1999 now abandoned, which is a continuation-in-part Application of U.S. patent application Ser. No. 08/925,343, filed Sep. 8, 1997, now U.S. Pat. No. 6,134,393, issued Oct. 17, 2000, which is hereby incorporated by reference.

FIELD OF THE INVENTION

The present invention is related to digital photography, to digital photography cameras and to an imaging device for same.

BACKGROUND OF THE INVENTION

One of the most important technologies in digital photography is the implementation of two dimensional imaging devices such as CCDs (Charge Couple Device) or CMOS (Complementary Metal Oxide Semiconductor) sensors in digital photography in general and in the body of standard camera format in particular.

In the case of a standard camera body, it is desired that the imaging device will function as a complete substitute for photographic film. This should provide an imaging area of the same size as the film exposed area and a geometry that enables the placement of the imaging device sensitive area at the film focal plane.

The imaging device is thick relative to standard photography film and is larger in size than its imaging area. These geometrical restrictions generate conflicts with standard camera bodies and therefore the imaging device is unsuitable as a complete substitute for a film.

Present art of digital cameras provide three methods for the implementation of an imaging device in a body of standard format.

The first solution involves building a camera body especially designed for accommodating an imaging device in the image plane. This solution is not suitable for use with the large selection of commercially available camera bodies. It is limited to camera bodies especially designed and manufactured for the specific imaging device. Such a solution is provided in StudioCam, manufactured by Agfa-Gevaert of Germany.

In a second solution, an imaging device is supplied which is smaller than the standard film format and is implemented in camera bodies which do not have a focal-plane shutter. This solution enables the implementation of the imaging device in commercially available camera bodies but many such cameras with a focal plane shutter may introduce serious mechanical difficulties. Furthermore, it is inconvenient for the photographer owing to the smaller imaging format. An example of a camera based on this solution is the CatchLight, manufactured by Leaf Systems, Inc. of Bedford, Mass., USA.

In the third method, an optical relay is used to transfer the image from the focal plane of the camera to the focal plane of the imaging device. Usually, magnification is used to provide an effective format which is the same as the film format. Such a solution is provided in the Fujix DS-505/DS-515, manufactured by Fuji Photo Film Co. of Japan. The drawbacks of this solution are costly optical relay, added weight of the optical relay and reduction of optical performance (sharpness and vignetting).

Imaging devices which are intended for use in the visible domain, such as the imaging devices of the present invention, have to be invariably protected by a glass cover. The glass cover also acts as a spectral filter, which is impregnated or coated with material that cuts off the infrared radiation. In the present art, this glass plate is mounted at a small distance from the imaging device itself and thus separated from the imaging device by an air gap. This configuration requires an anti-reflective coating on the glass plate in order to prevent the creation of imaging ghosts caused by internal reflections of rays in the glass, prior to completion of the optical path to the plane of the imaging device, due to the difference in the refraction index of air and the glass plate.

This present art configuration has several disadvantages. The anti-reflective coating and the infrared coating, if it exists, are potential causes of quality problems. For example, the coatings may easily be damaged by cleaning, which is required whenever the camera back containing the imaging device is removed. Additionally, the coating may peel during the handling required for camera back assembly. Furthermore, the cost of infrared cutoff coating or of infrared cutoff glass is relatively high and only special cleaning materials may be used to clean the coated glass.

SUMMARY OF THE INVENTION

The present invention provides improved imaging devices and cameras including the imaging devices for imaging, such as in digital photography.

According to one embodiment of the present invention the imaging device includes an imaging die having an electrical circuit on a surface thereof, a glass cover having a first surface and a second surface, and connecting means for connecting the first surface of the glass cover to the surface of the imaging die, wherein the connecting means have a refractive index substantially equal to the refractive index of the glass cover.

According to another embodiment of the present invention there is provided a camera including: a camera body, and an imaging device including: an imaging die having an electrical circuit on a surface thereof, a glass cover having a first surface and a second surface, and connecting means for connecting the first surface of the glass cover to the surface of the imaging die, wherein the connecting means have a refractive index substantially equal to the refractive index of the glass cover.

According to yet another embodiment of the present invention the connecting means is glue.

According to an additional embodiment of the present invention the connecting means includes spectral filtering means.

According to yet an additional embodiment of the present invention the first surface of the glass cover is coated with spectral filtering means.

According to a further embodiment of the present invention the spectral filtering means includes an infra-red absorbing filter.

BRIEF DESCRIPTION OF THE DRAWING

The present invention will be understood and appreciated more fully from the following detailed description taken in conjunction with the appended drawings in which:

FIGS. 5A and 5B are cross sectional views of a imaging device constructed and operative in accordance with a further preferred embodiment of the invention;

DETAILED DESCRIPTION OF THE INVENTION

The description hereinbelow is made in reference to 35 mm photographic systems. This is made in a way of example and it does not limit the scope of the invention.

Figure 1:
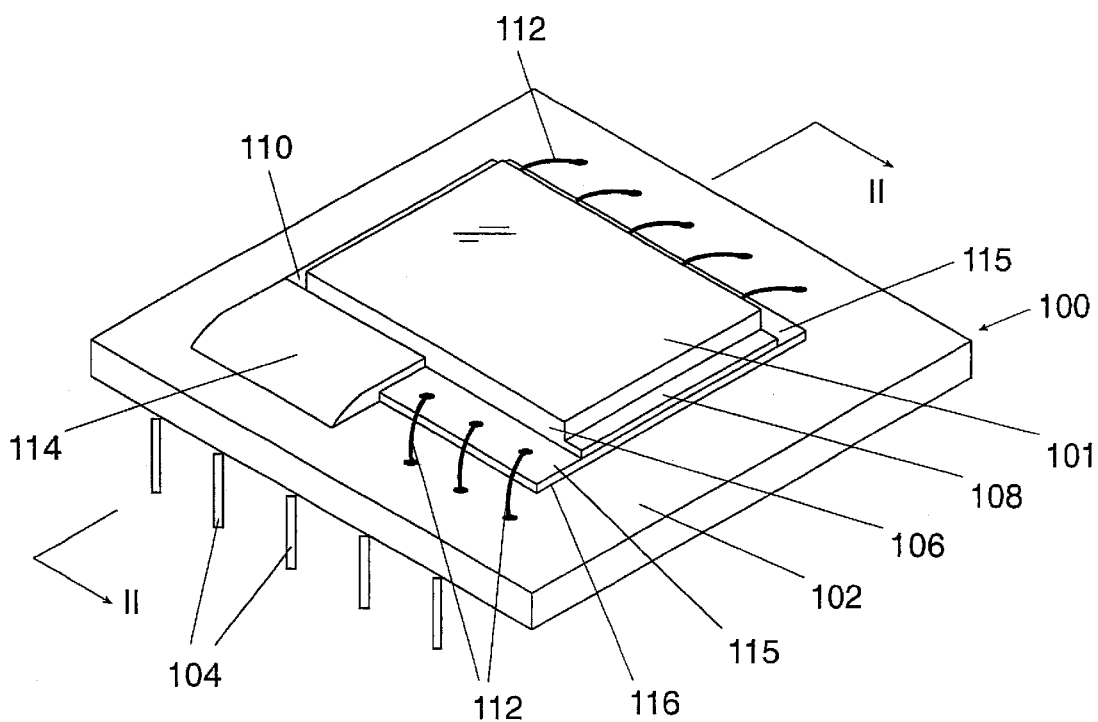
FIG. 1 is a general schematic view of an imaging device, constructed and operative in accordance with a preferred embodiment of the invention.

Reference is made to FIG. 1, which is a general schematic view of an imaging device, generally designated 100, in accordance with a preferred embodiment of the invention.

Imaging device 100 comprises a glass cover 106, having two leading edges, referenced 108 and 110, which are glued directly to the upper surface 115 of a semiconductor die 116. The two leading edges, referenced 108 and 110, are parallel to the longer (36 mm) side of the die 116. Any suitable glue, such as glues used for gluing doublets in optical systems may be used. Glass cover 106 is generally concentric with the sensitive area, referenced 101, of die 116.

The imaging device sensitive area 101 of the imaging device 100, is configured to match the size of a standard 35 mm format, that is 24 mm×36 mm. The glass cover 106 is approximately 35 mm long (along edge 108) and approximately 24 mm wide. Thus, glass cover 106 can be fitted into the opening of standard 35 mm camera bodies. The imaging device sensitive area 101 is centrally positioned on the surface 115 of the imaging device die 116. The die 116 is mounted on to a supporting element, referenced 102. Support element 102 may comprise any suitable shape and is shown in FIG. 1, for the purposes of example only and without being in any way limiting to the invention, as having a generally rectangular configuration.

Pins 104 connect the die 116 of the imaging device 100 to an electrical circuit board (not shown) for operating the imaging device 100. Connecting wires 112 provide the electrical contact from the device 100 to the pins 104.

A protective layer 114 is provided to cover and protect wires 112 from mechanical damage. The height of layer 114 is generally limited to the height of edges 108 and 110. In FIG. 1, only a part of the protective layer 114 is shown to provide a view of the connecting wires 112. Layer 114 is made from electrically insulating epoxy glue or any other suitable material, known in the art.

Leading edges 108 and 110 are used to position the imaging device 100 on to the film leads in the 35 mm camera body. Leading edges 108 and 110 are located at the focal plane of the camera. The total thickness of glass cover 106 together with the edges 108 and 110 provide a shift in the effective focal plane so that the effective focal plane will coincident with the sensitive surface area 101 of die 116. An example of a suitable glass cover 106 is the material known as BK7, which has an index of refraction of approximately 1.5. The change in the focal plane is approximately ⅓ (one third) of the thickness of the glass cover. Thus, the thickness of edges 108 and 110 are approximately ⅓ of the total thickness of glass cover 106.

In the preferred embodiment of FIG. 1, the wires 112 connecting the semiconductor die 116 to the supporting element 102 are located beside the shorter (24 mm) edges of the device since the glass cover 106 covers the full length (36 mm) of the leading edges 108 and 110.

Figure 2:
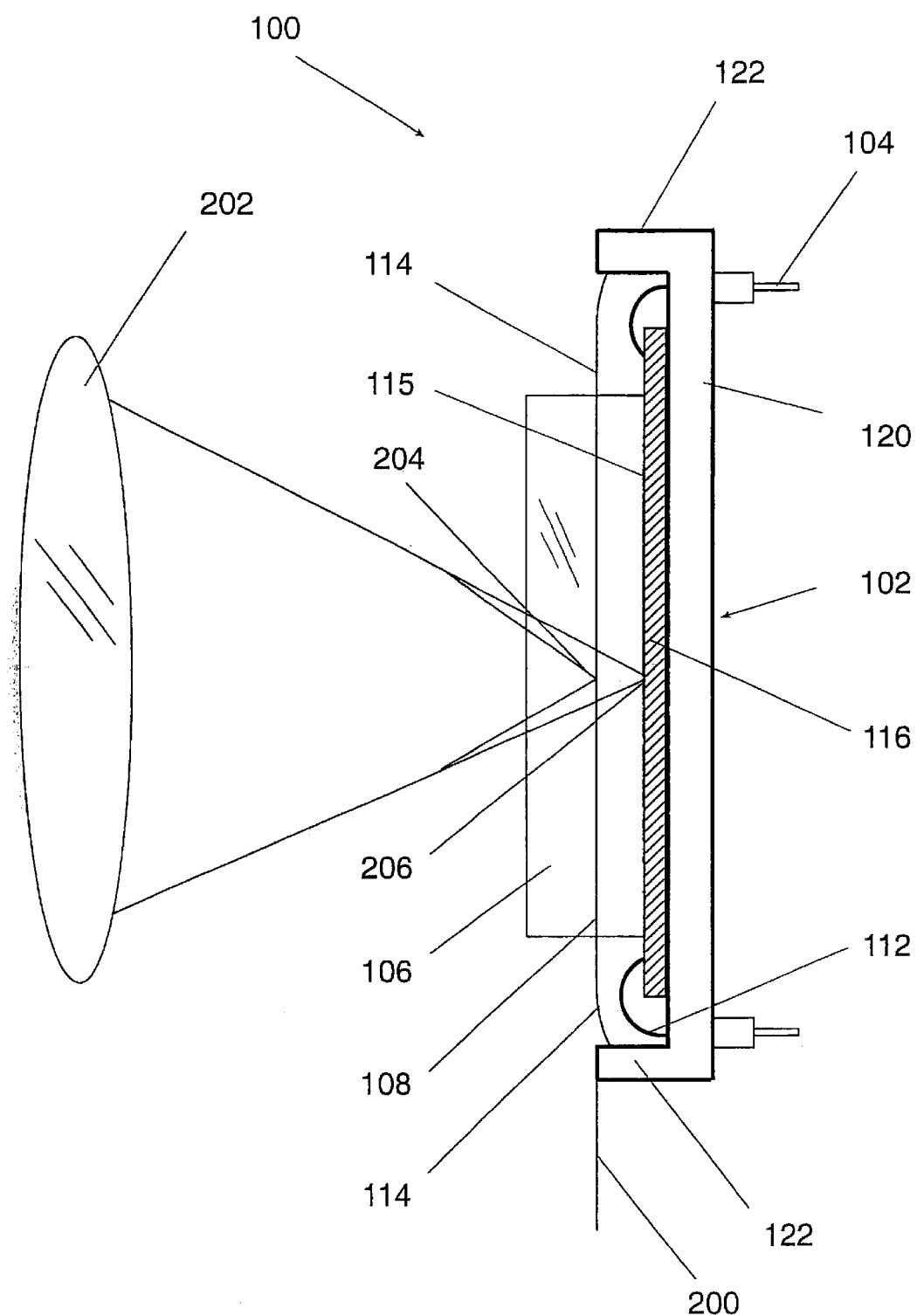
FIG. 2 is a detailed cross-sectional view of the imaging device of FIG. 1, taken along lines II—II.

Reference is now made to FIG. 2, which is a detailed cross-sectional view of the imaging device 100 of FIG. 1. Glass cover 106 is not shown cross-sectioned, for clarity. Also shown in FIG. 2 is the camera lens 202.

Support element 102 is shown in FIG. 2, for the purpose of example only, as having an open box-like shape, having a base 120 and open sides 122 extending perpendicularly from base 120. The open box-like shape provides additional protection to the imaging device 100 and connecting wires 112. The sides 122 of the support element 102 are limited in height so as not to extend above the focal plane, referenced 200 of the camera body, that is sides 122 are the same height as the leading edges 108 and, 110 of the glass cover 106.

Protective layer 114, such as any epoxy glue, fills the space between the sides of support element 102 and the glass cover 106. The wires 112 and the edges of the semiconductor die 116 are protected from mechanical damage by protective layer 114.

Lens 202, which is designed to image an object onto the focal plane 200 of the camera's film, has a focal point, referenced 204. Due to the presence of glass cover 106, the focal point is shifted to a position, referenced 206.

Figure 3:
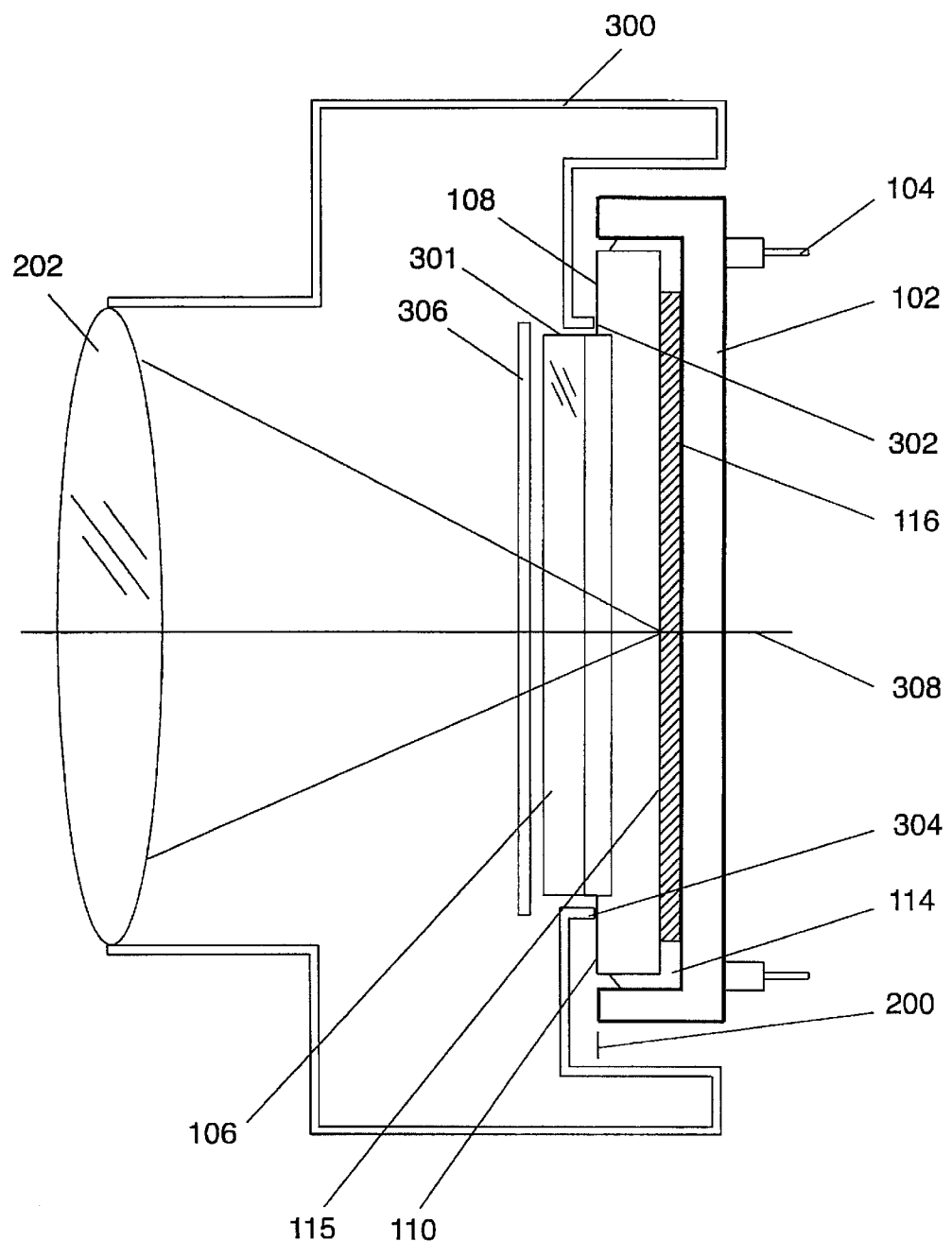
FIG. 3 is a cross-sectional view of the imaging device of FIG. 1 attached to a camera body.

Reference is now made to FIG. 3, which is a cross-sectional view of the CMOS or CCD imaging device 100 of FIG. 1, perpendicular to the view II—II, shown in FIG. 2. The imaging device 100 is shown mounted onto a 35 mm camera body, generally designated 300.

Camera body has an optical axis, indicated by line 308 and comprises a focal-plane shutter 306 and film leads referenced 302 and 304. Shutter 306 is placed proximate to the focal plane 200 of the camera 300 (approximately 2.5 mm, in the example). The front portion of glass cover 106 protrudes through an opening in the camera body 300. If the opening in the camera body 300 is exactly 24 mm×36 mm, the front portion of glass cover 106 is reduced by chamfering, or similar, to fit.

The leading edges 108 and 110 of cover 106 are in contact with film leads 302 and 304. This ensures the correct positioning of the imaging device 100 along its optical axis 308.

In a typical example, the total thickness of glass cover 106 is approximately 2.1 mm, and the thickness of edges 108 and 110 is approximately 0.7 mm. The front end of glass cover 106 penetrates approximately 1.4 mm from focal plane 200 towards shutter 306, leaving a distance of approximately 1.1 mm between the shutter 306 and the glass cover 106.

Figure 4:
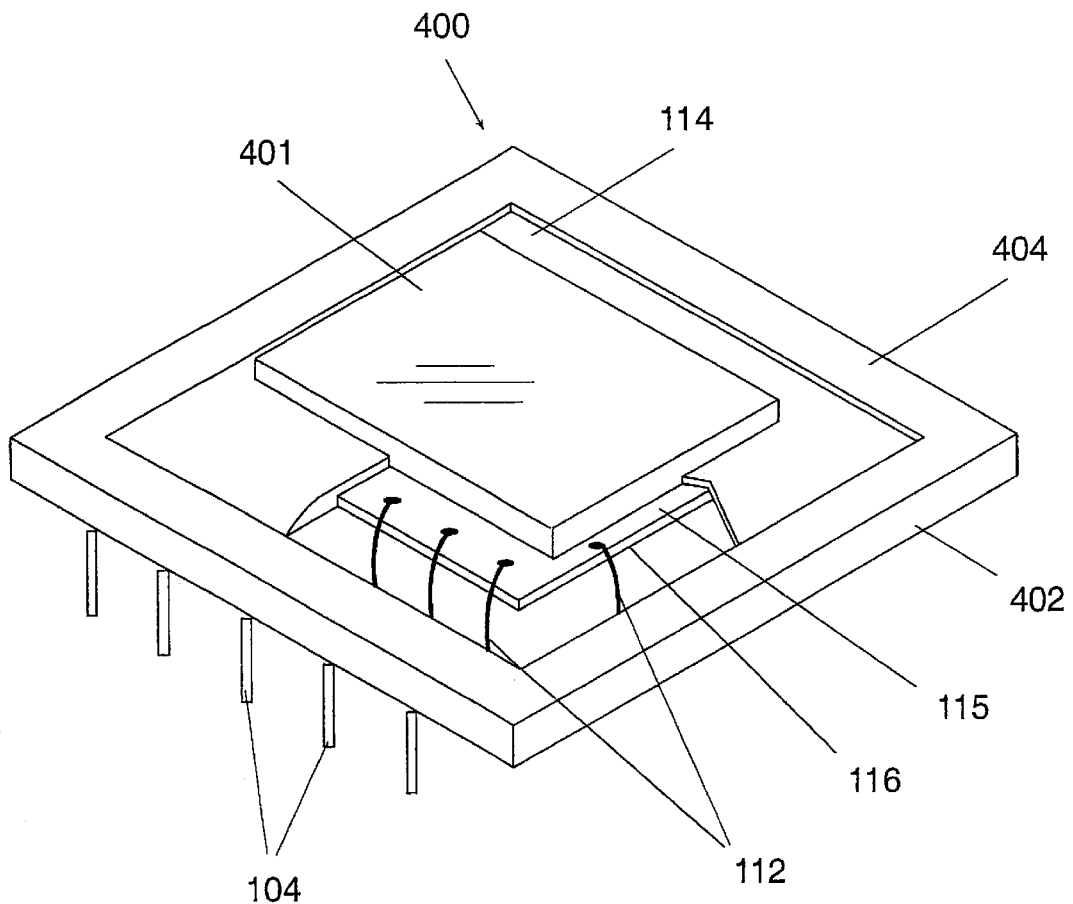
FIG. 4. is a general schematic view of an imaging device, constructed and operative in accordance with a further preferred embodiment of the invention.

A further embodiment of an imaging device, generally designated 400 is illustrated in FIG. 4, to which reference is now made. Imaging device 400 is similar to imaging device 100, described hereinabove with respect to FIGS. 1–3. Elements of this embodiment of the invention which are similar to elements which have been previously described with respect to the preferred embodiment hereinabove, are similarly designated and will not be further described.

Imaging device 400 comprises a glass cover 401. Glass cover 401, which replaces glass cover 106 (FIGS. 1–3), is designed in the shape of a box and is generally more simple to manufacture. Part of protective layer 114 is shown removed in order to show the die 116 and connecting wires 112.

Support element 402, which performs the same function as support element 102 (of FIG. 1), comprises a rectangular box-like structure having a projecting upstand 404 around its perimeter. The upstand 404 acts as the reference plane to position the imaging device 400, in a manner similar to the leading edges 108 and 110 of support element 102 of FIG. 1. Support element 402 extends above die surface 115 (of die 116) by an amount equal to approximately ⅓ of the thickness of glass cover 400. The exact amount depends on the index of refraction of the glass cover 400.

When mounted onto a camera body, such as camera body 300 of FIG. 3, the upstand 404 is placed in contact with film leads 302 and 304, in order to set the imaging device 400 in the correct position with reference to optical axis 308.

In this embodiment, wires 112 may be positioned along any of the four edges of the die, as shown.

In yet another embodiment of the invention, wires 112 are removed from the front side of the die 116. This allows a thinner glass cover to be used, thus increasing the distance between the front of the glass cover and camera shutter 306. It enables the device of the present invention to be designed for camera bodies having a shutter that is nearer the focal plane of the camera.

Reference is now made to FIGS. 5A and 5B, which are cross sectional details of an imaging device, generally designated 500. FIG. 5B is an enlarged detail illustrating the method of connection of the wires 112 to the rear side of die 116.

Imaging device 500 is similar to CMOS or CCD imaging device 400, described hereinabove with respect to FIG. 4. Elements of this embodiment of the invention which are similar to elements which have been previously described with respect to the preferred embodiment hereinabove, are similarly designated and will not be further described. A hole 506 is formed in the semiconductor die 116 using any well known silicon etching technique, such as the technique mentioned in the article "*Ink Jet Printing Nozzle Arrays Etched in Silicon*" by E. Bassous et al, App. Phys. Let., 31(2), 135, 1977. The top and lower surfaces 508 and 509, respectively, adjacent to hole 506 are also etched. An oxidization layer of silicon-dioxide is coated on to the inner faces of hole 506 and surfaces 508 and 509, to provide electrical isolation. A conducting material, such as aluminum, is deposited in the shape of a conducting band, on top and lower surfaces 508 and 509, respectively, and inside hole 506 to form a bonding pad 512, on the rear side of the die 116, for wire 112. An opening 514 is formed in support element 402 to enable the bonding machine to bond wire 112 to bonding pad 512, a process that is done from one direction, as is in conventional bonding machines.

In this embodiment, wires 112 can be positioned along any of the four edges of the die, as shown.

Surface 115, which is not protected by glass cover 400, is coated with a thin layer of any suitable isolating material for protection. Hole 514 can be filled with protecting material 114 from the rear side of the die for wire protection.

Figure 6:
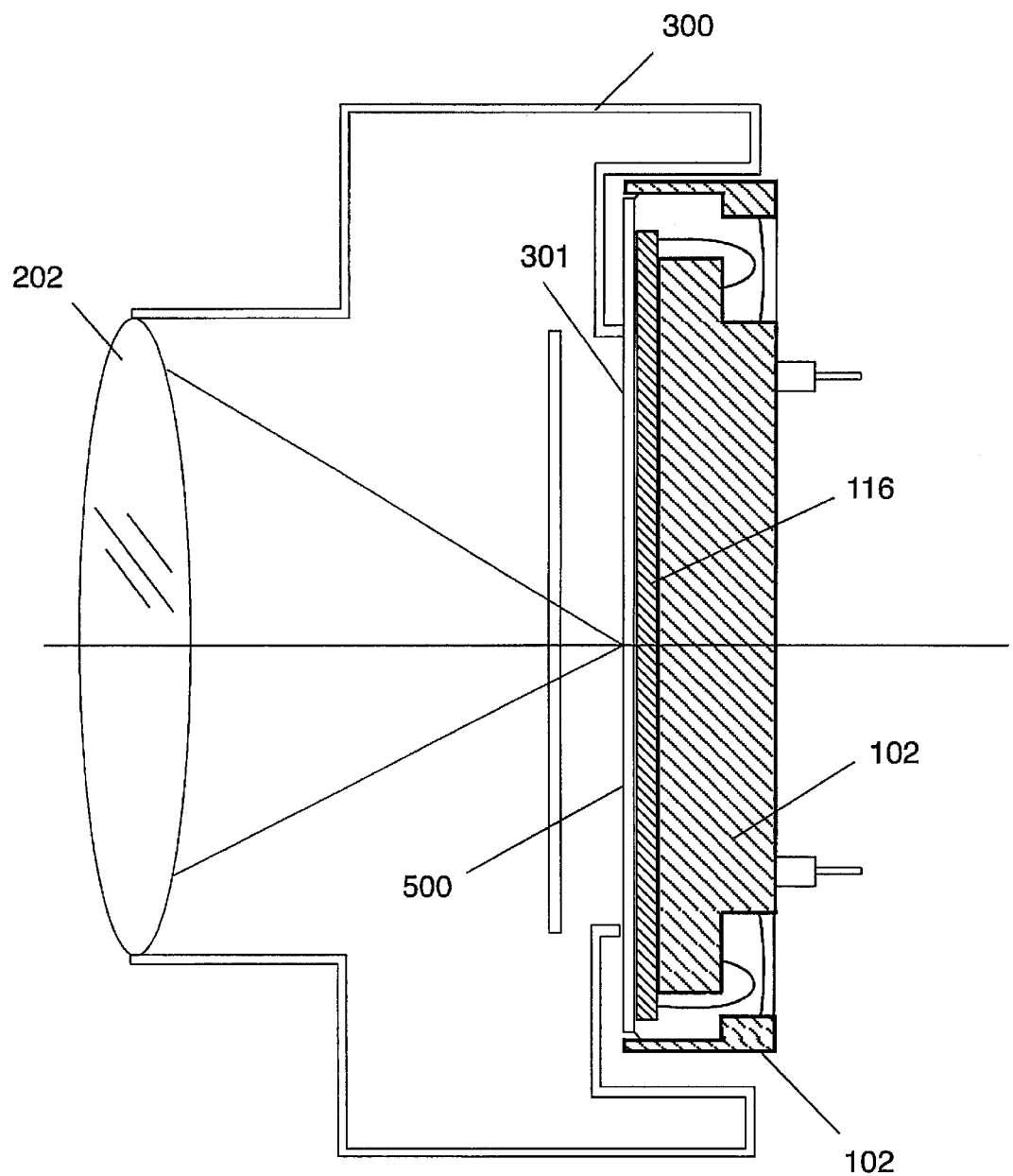
FIG. 6 is a schematic illustration of the imaging device of FIGS. 5A and 5B, attached to a camera body.

This embodiment enables the application of 0.1–1 mm glass cover 401 over part or all of the surface area 115 of die 116. As such, the apparatus may be placed directly onto the film leads, without inserting part of the glass cover 401 into the camera body opening. The effective position of the sensitive area will be approximately ⅔ (two thirds) mm away from the desired position. This results in a relatively small limitation on focusing to infinity when using a camera body which is not designed to compensate for this. For example, using a conventional 35 mm camera body with 55 mm lens such as Micro-NIKKOR of Nikon, Japan, and 1 mm glass cover the effective range of nominal focusing is reduced to 4.5 m. By using F-stop 22, all ranges, including infinity, are accessible thus this limitation becomes negligible when using 0.1 m glass cover. FIG. 6 is a schematic illustration of CMOS or CCD imaging device 500, attached to a camera body 300.

Figure 7:
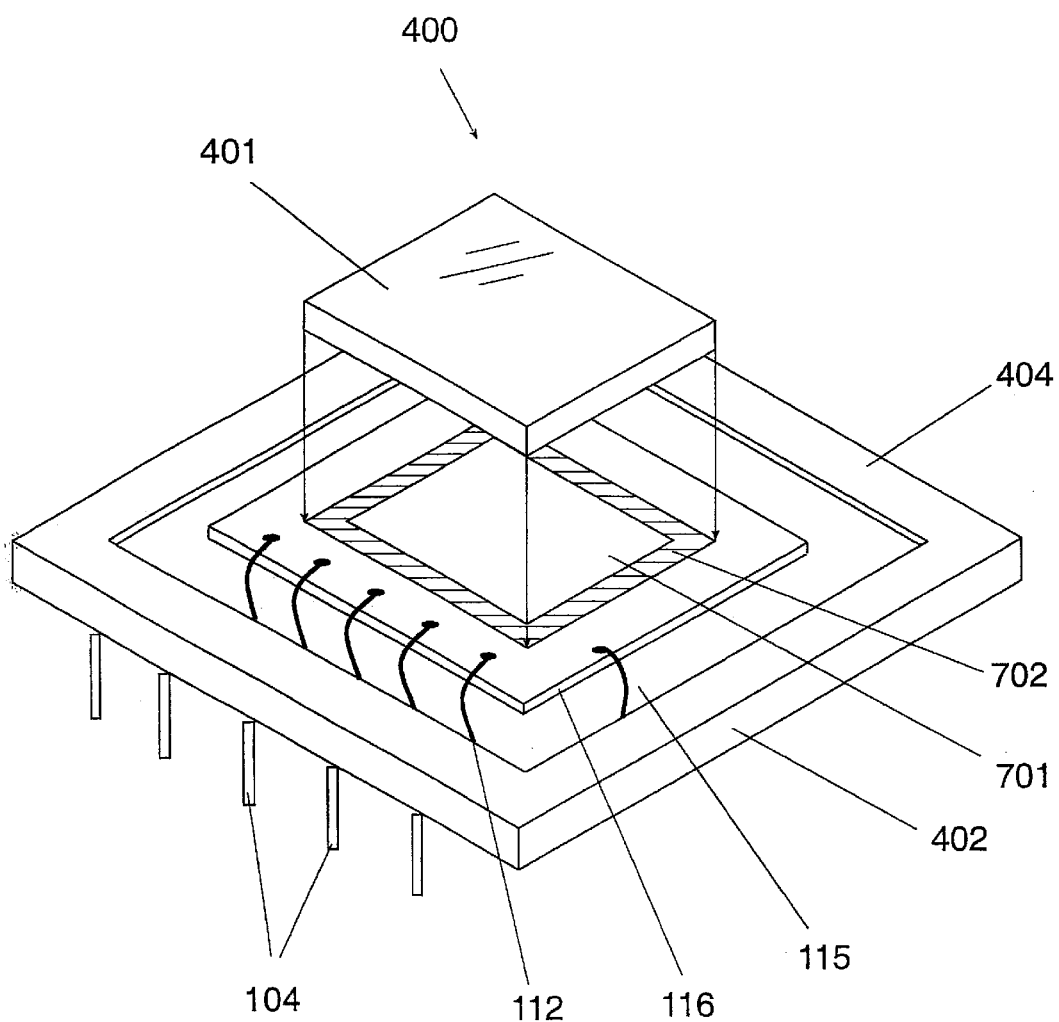
FIG. 7 is a schematic illustration of an imaging device in accordance with a further preferred embodiment of the invention.

An alternative embodiment of the invention is described with reference to FIG. 7. The embodiment of FIG. 7 is similar to the embodiment described hereinabove with respect to FIG. 4. The glass cover 401 is shown raised above the die 116 for clarity.

Deposition of glue over the whole area of the glass cover 401 may be problematic since the glue may induce damage to the color dyes deposited over the imaging area, referenced 700. One possible solution is to place the glue only along the perimeter, (shown by shading 702) of the glass cover 401, that is outside the sensitive area 701 containing the dyes. The application of the glue may be carried out by printing or any other suitable technique. The glue may be placed on the glass cover 401 or the sensitive area 701.

Preferably, the glass cover 401 is then placed on top of the die, 116, and placed in a vacuum chamber. By applying vacuum, the glass cover 401 becomes pressed against the sensitive area 701 of die 116. At the same time, the glue is prevented from spreading to the area covered by the dyes. Any excess glue is removed.

It is appreciated that this technique is not limited to the mechanical design of the imaging device 400 as shown in FIG. 7.

In yet another embodiment of the invention, the glass cover may be enhanced to provide spectral filtering requirements. Examples of such requirements are Infra-Red blocking (IR), Anti-Reflective coating (AR) and Band-Pass filter (BP).

Figure 8A:
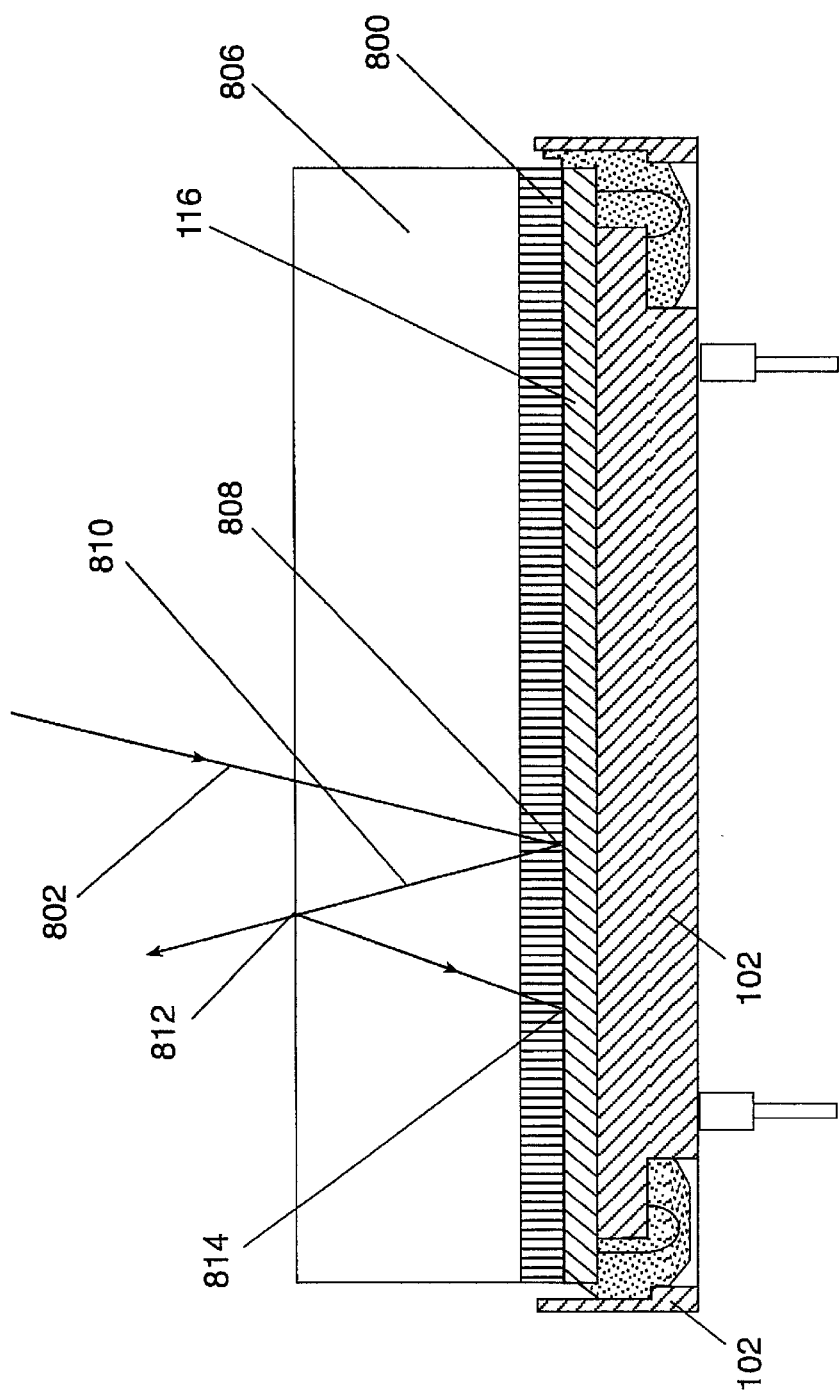
FIGS. 8A–8C are cross sectional views of an imaging device of the present invention without (FIG. 8A) and with (FIGS. 8B and 8C) spectral filtering.
Figure 8B:
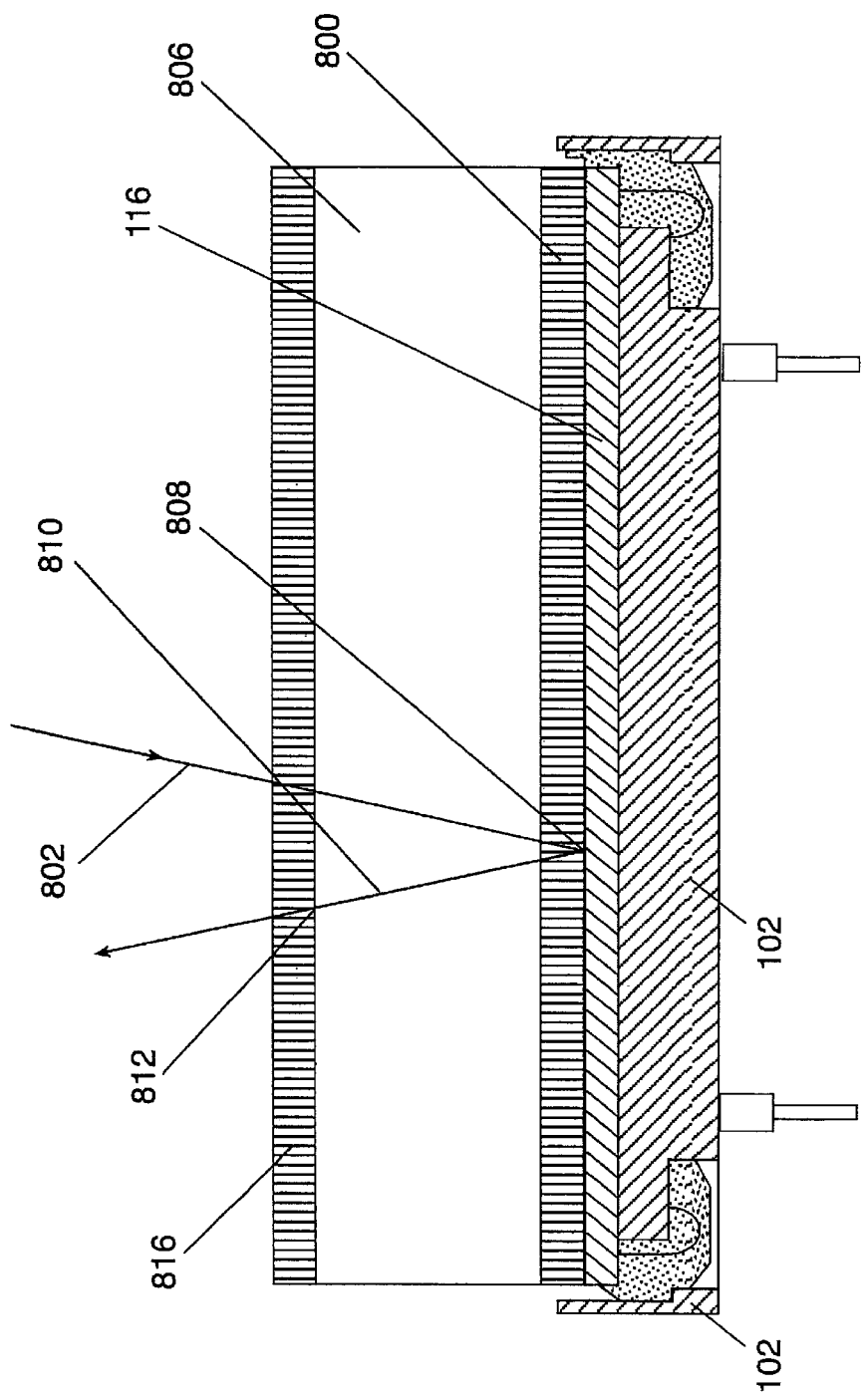

The use of such enhancements is described with reference to FIGS. 8A through 8C. Reference is made now to FIG. 8A which is a cross sectional view of an imaging device of the present invention without treatment for spectral filtering. Light ray 802 incidence on surface 804 of coverglass 806. Ray 802 penetrates cover glass 806 and glue layer 800 and incidences on sensor 116 at position 808, where it generates the desired signal. However, part of the energy of ray 802 is reflected from the surface of sensor 116 as shown by ray 810. Part of ray 810 reflects back from cover glass surface 804 at point 812 (for air-glass interface the amount of reflected energy is about 4%) and is incidenting on sensor 116 at point 814. This generates an undesired signal called ghost or scattered light.

To avoid this effect, an AR coating is applied on surface 804 of cover glass 806. By applying an AR coating, the internal reflection from point 812 is minimized and so is the effect on the image quality. This is demonstrated in FIG. 8B which is a cross sectional view of an imaging device in accordance with the present invention having an AR coating. The AR coating is indicated by reference number 816. Suitable AR coating is available from optical coating companies such as OCLI Optical Coatings Ltd. of Scotland.

When using sensors for the visible range, it is desired to block Infra-Red illumination to prevent contrast distortion in black and white images or color distortion in color imagers. Silicon based sensors, for example, are Infra-Red sensitive.

Figure 8C:
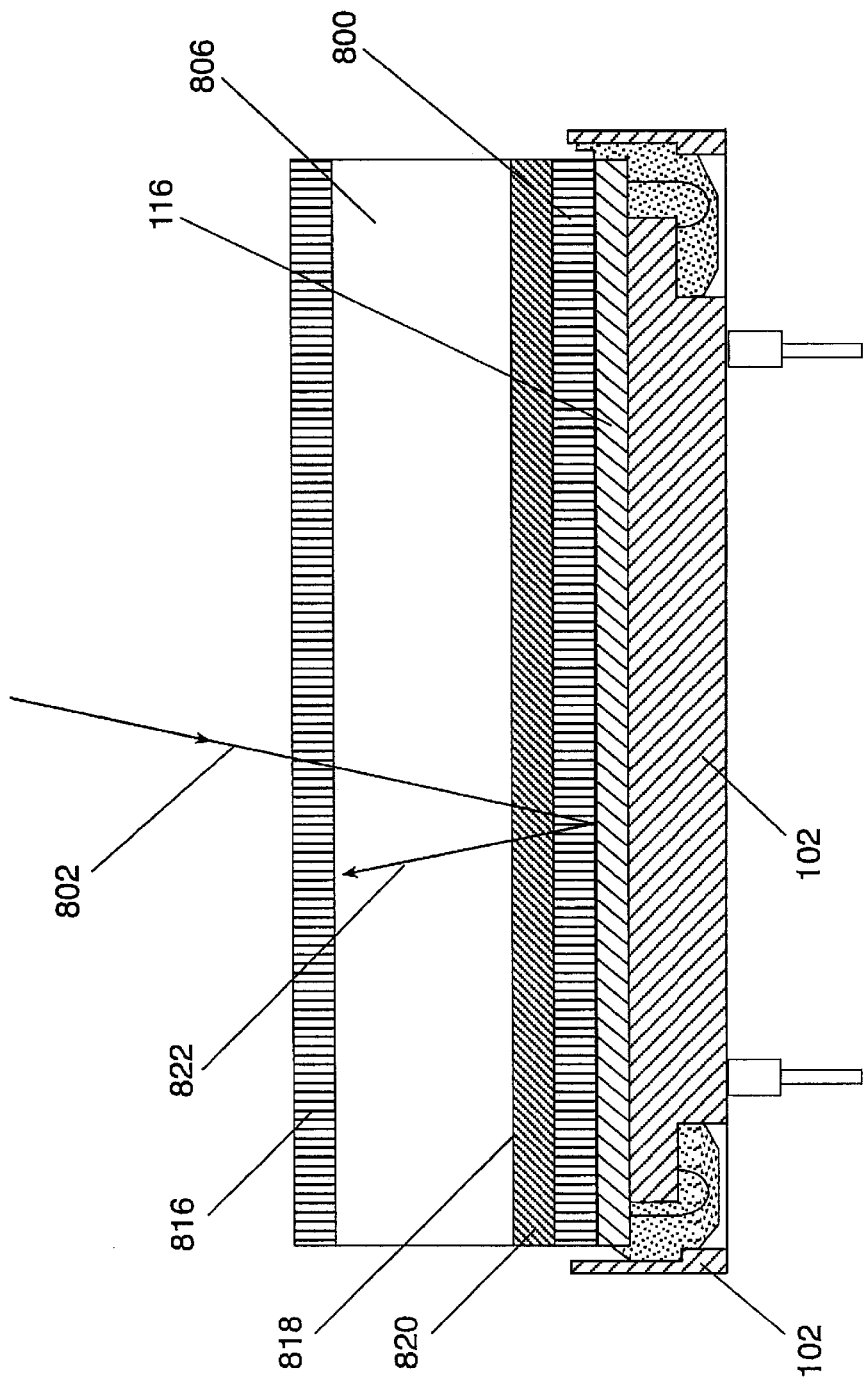

FIG. 8C illustrates an imaging device with an optical IR blocking coating that is deposited on internal surface 818 of glass cover 806. The coating is represented by reference numeral 820.

Ray 802 that includes IR radiation incidents on IR coating 820. The IR radiation is then reflected by the IR coating as indicated by ray 822. Only the visible part of the radiation incidents onto the sensor to generate a signal. IR coating is available from optical coating companies such as OCLI Optical Coatings Ltd. of Scotland.

In yet another embodiment of the invention, instead of using IR coating an IR absorbing glass cover may be used. The configuration is the same as in FIG. 8B except that glass cover 806 is made from an IR absorbing material such as a BG 38 available from Schott Optical Glass Inc. of Mainz, Germany.

The IR and AR solutions provided hereinabove are not limited to the packaging configuration illustrated in FIGS. 8A through 8C and may be implemented with other packaging configurations.

In yet another embodiment of the present invention, the glass cover is connected to the imaging device by connecting means such as glue, and the refractive index of the connecting means connecting the glass cover to the imaging device is chosen to be approximately equal to the refractive index of the glass cover. In this configuration, the only internal reflections are created by the surface of the imaging device, which, being silicon, is a poor reflector. Therefore, as the ghosting from internal reflections becomes indiscernible, the glass plate does not require any anti-reflective coating.

The use of such configuration is described with reference to FIGS. 9A and 9B. Elements of these embodiments of the invention which are similar to elements which have been previously described with respect to other embodiments hereinabove, are similarly designated and will not be further described.

Figure 9A:
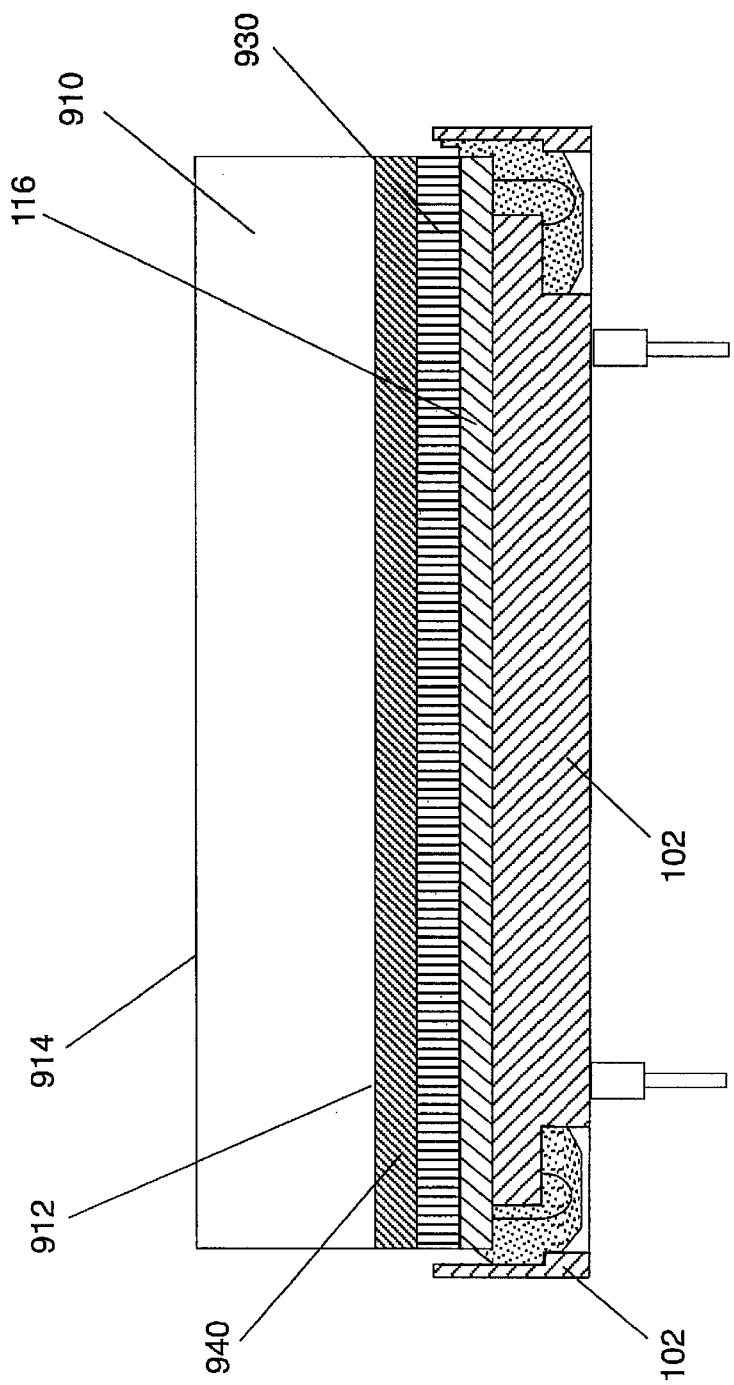
FIGS. 9A and 9B are cross sectional views of an imaging device of the present invention in which the glass cover is connected to the imaging device by connecting means having index approximately equal to the refractive index of the glass.

Reference is now made to FIG. 9A which is a cross sectional view of an imaging device of the present invention in which the glass plate is connected to the imaging device by connecting means having refractive index approximately equal to the refractive index of the glass. Glass plate 910 is affixed to imaging device 116 by means of glue 930 having refractive index approximately equal to the refractive index of the glass plate 910. The spectral filtering requirements, such as IR filtering, are fulfilled by coating the glass plate 910 with infrared cutoff coating 940 prior to affixing it to the imaging device. The IR filtering coating 940 is placed on the inner surface 912 of the glass plate 910 which is in contact with the imaging device, thus sealing it and preventing it from being damaged when the outer surface 914 of the glass plate 910 is being cleaned. Since no anti-reflective coating is required, the outer surface 914 of the glass plate 910 is uncoated and therefore less liable to be damaged. Accordingly, a larger, less complex range of cleaning materials may be used.

Figure 9B:
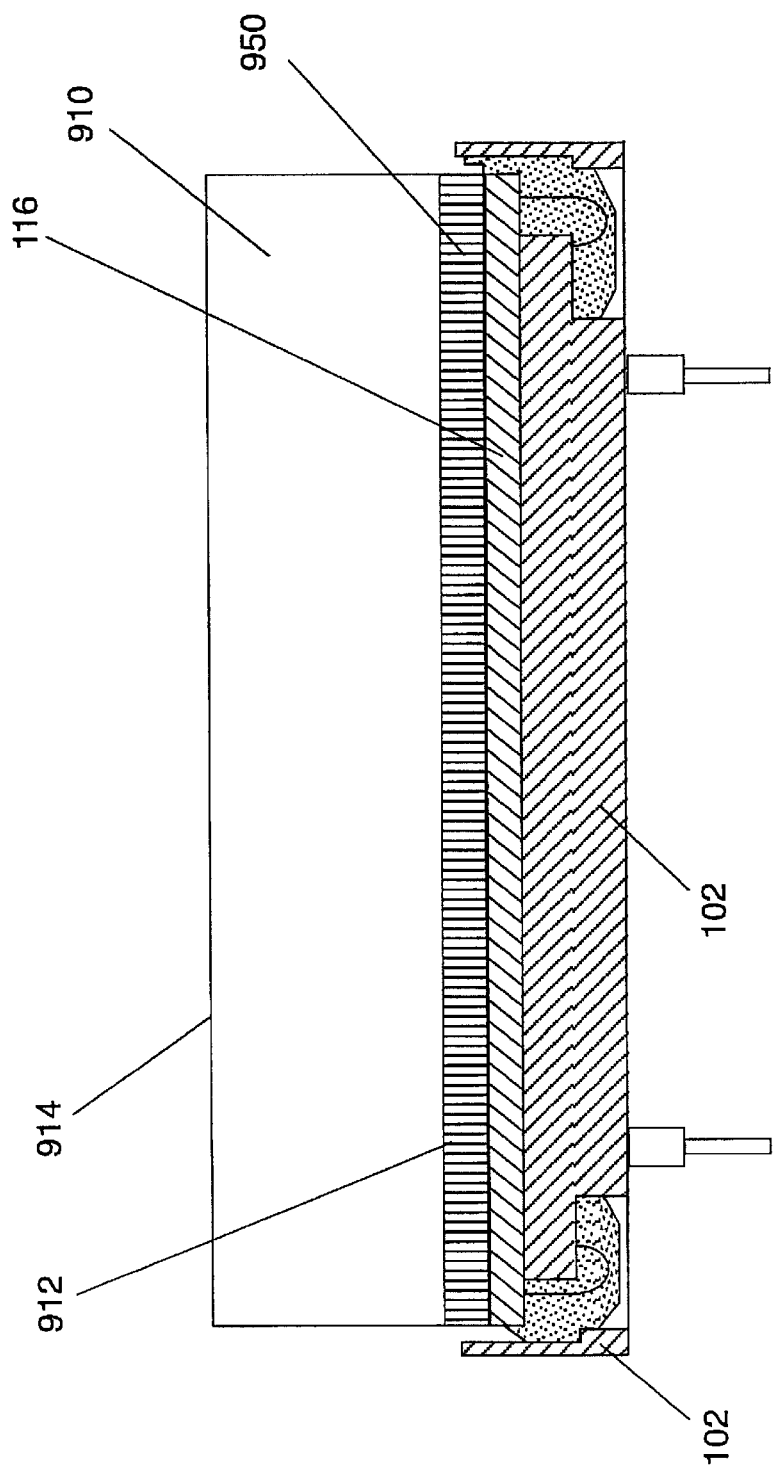

Reference is now made to FIG. 9B which is a cross sectional view of an additional imaging device of the present invention in which the glass plate is connected to the imaging device by connecting means having refractive index approximately equal to the refractive index of the glass. In this embodiment, glue 950 is mixed with trace amounts of dyes having an infrared cutoff response. No additional coating for optical filtering is thus required, as the spectral filtering requirements are fulfilled by the connecting means itself. A typical set of dyes providing an appropriate spectral response, which may be mixed with a connecting glue, can be, for example, equal amounts of Epolight dyes 3079, 4101, 4121, 4037, 4129 and SDA dye 7684. Epolight dyes may be obtained from Epolin, Inc., 358–364 Adams Street, Newark, N.J. 07105, USA. SDA dyes may be obtained from H. W. Sands Corp., 1080 E. Indiantown Road, Suite 206, Jupiter, Fla. 33477, USA.

It will be appreciated by persons skilled in the art that these dyes may be replaced by any combination of dyes providing a suitable infrared cutoff spectral response. It will be appreciated that although the illustrated imaging devices hereinabove refer to 35 mm photographic systems, the invention is applicable to other photographic systems such as APS (Advanced Photo System), 6×6 and 6×7 formats.

It will also be appreciated that although the illustrated imaging devices hereinabove refer to CCD or CMOS, the invention is applicable to other suitable imaging devices as well.

It will further be appreciated that the imaging devices having the designs and packaging described hereinabove are useful for any digital photography cameras, for example in non-standard cameras (i.e. specially designed imaging optical systems) where space is limited and a compact optical packaging arrangement of the imaging sensor is desired. It will further be appreciated that the front die surface may be a color (with dye) sensor.

It will also be appreciated that the embodiments described hereinabove are provided as examples and that the scope of the invention is not limited to digital photography. Rather, the scope of the invention is directed to imaging devices as defined by the claims hereinbelow.

What is claimed is:

1. An imaging device comprising:

an imaging die having an electrical circuit on a surface thereof;

a glass cover having a first surface and a second surface; and connecting means for connecting said first surface of said glass cover to said surface of said imaging die;

wherein said connecting means have a refractive index substantially equal to the refractive index of said glass cover; and wherein said connecting means include spectral filtering means.

2. An imaging device according to claim 1 wherein said spectral filtering means includes an infra-red absorbing filter.

3. A camera comprising a camera body; and an imaging device comprising:

an imaging die having an electrical circuit on a surface thereof;

a glass cover having a first surface and a second surface; and connecting means for connecting said first surface of said glass cover to said surface of said imaging die;

wherein said connecting means have a refractive index substantially equal to the refractive index of said glass cover; and wherein said connecting means include spectral filtering means.

4. A camera according to claim 3 wherein said spectral filtering means includes an infra-red absorbing filter.

* * * * *

UNITED STATES PATENT AND TRADEMARK OFFICE
CERTIFICATE OF CORRECTION

PATENT NO.      : 6,564,018 B2
DATED           : May 13, 2003
INVENTOR(S)     : Melman, Haim Zvi et al.

It is certified that error appears in the above-identified patent and that said Letters Patent is hereby corrected as shown below:

<u>Title page,</u>
Item [73], after "Assignee:" please delete "Creoscitex Corporation Ltd., Herzlia (IE)" and replace with -- Creo IL. Ltd., Herzlia (IL) --

Signed and Sealed this

Twenty-eighth Day of October, 2003

JAMES E. ROGAN
*Director of the United States Patent and Trademark Office*